US009324894B2

(12) United States Patent
Dogimont et al.

(10) Patent No.: US 9,324,894 B2
(45) Date of Patent: Apr. 26, 2016

(54) GLASS SHEET WITH HIGH ENERGY TRANSMISSION

(71) Applicant: AGC GLASS EUROPE, Louvain-la-Neuve (BE)

(72) Inventors: Audrey Dogimont, Gosselies (BE); Sebastien Hennecker, Gosselies (BE); Thomas Lambricht, Gosselies (BE)

(73) Assignee: AGC Glass Europe, Louvain-la-Neuve (BE)

( * ) Notice: Subject to any disclaimer, the term of this patent is extended or adjusted under 35 U.S.C. 154(b) by 0 days.

(21) Appl. No.: 14/358,237

(22) PCT Filed: Sep. 27, 2012

(86) PCT No.: PCT/EP2012/069034
§ 371 (c)(1),
(2) Date: May 15, 2014

(87) PCT Pub. No.: WO2013/072113
PCT Pub. Date: May 23, 2013

(65) Prior Publication Data

US 2014/0326314 A1 Nov. 6, 2014

(30) Foreign Application Priority Data

Nov. 15, 2011 (BE) .................................. 2011/0664

(51) Int. Cl.
*B32B 17/00* (2006.01)
*B32B 15/00* (2006.01)
(Continued)

(52) U.S. Cl.
CPC ............ *H01L 31/0481* (2013.01); *C03C 3/087* (2013.01); *C03C 3/095* (2013.01);
(Continued)

(58) Field of Classification Search
USPC ......... 428/426, 428, 432, 688, 689, 697, 699, 428/701, 702
See application file for complete search history.

(56) References Cited

U.S. PATENT DOCUMENTS

2003/0125188 A1 7/2003 Koyama et al.
2004/0157722 A1 8/2004 Koyama et al.
(Continued)

FOREIGN PATENT DOCUMENTS

CN 101 462 825 2/2011
EP 1 291 330 3/2003
KR 2009 0132742 12/2009

OTHER PUBLICATIONS

Elment (http://www.elment.nl/en/goal-eng/self-cleaning-eng/photocatalytic-eng).*
(Continued)

*Primary Examiner* — Lauren R Colgan
(74) *Attorney, Agent, or Firm* — Oblon, McClelland, Maier & Neustadt, L.L.P.

(57) ABSTRACT

The invention relates to an extra-clear glass sheet, i.e. a glass sheet with high energy transmission, which can be used in particular in the field of solar energy. Specifically, the invention relates to a glass sheet having a composition that includes, in an amount expressed in wt % for the total weight of the glass: 60-78% of $SiO_2$; 0-10% of $Al_2O_3$; 0-5% of $B_2O_3$; 0-15% of CaO; 0-10% of MgO; 5-20% of $Na_2O$; 0-10% of $K_2O$; 0-5% of BaO, wherein the total amount of iron (in the form of $Fe_2O_3$) is 0.002-0.03%, and the composition includes a ratio of manganese/(total iron) of 1 to 8.5, the manganese content being expressed in the form of MnO in wt % relative to the total weight of the glass.

20 Claims, 2 Drawing Sheets

Figure 1:
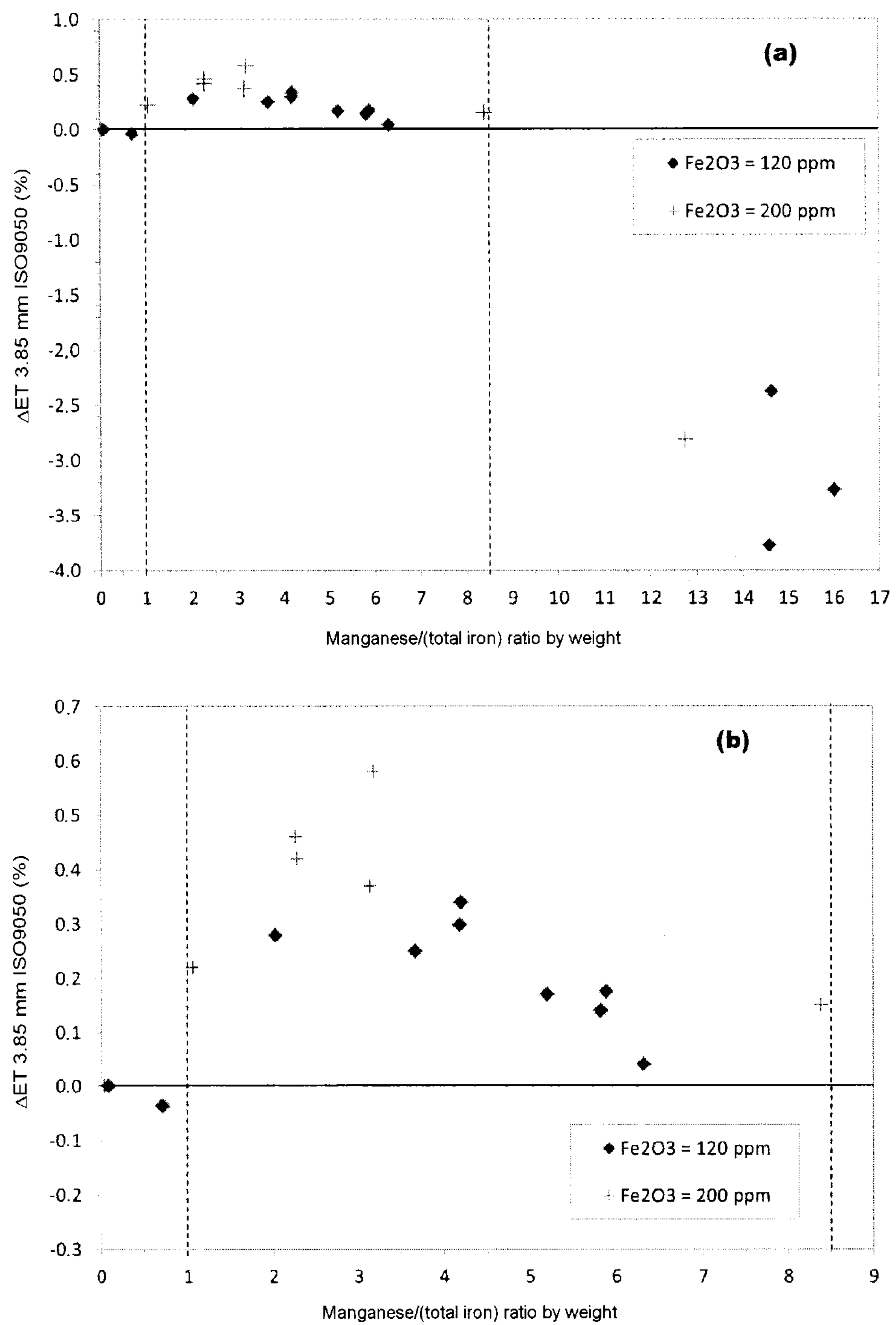

(a)
ΔET 3.85 mm ISO9050 (%)
Fe2O3 = 120 ppm
Fe2O3 = 200 ppm
Manganese/(total iron) ratio by weight (b)
ΔET 3.85 mm ISO9050 (%)
Fe2O3 = 120 ppm
Fe2O3 = 200 ppm
Manganese/(total iron) ratio by weight

(51) Int. Cl.

| | |
|---|---|
| ***H01L 31/048*** | (2014.01) |
| ***C03C 3/087*** | (2006.01) |
| ***C03C 3/095*** | (2006.01) |
| ***C03C 4/00*** | (2006.01) |
| ***G02B 1/10*** | (2015.01) |
| ***G02B 1/11*** | (2015.01) |
| ***G02B 5/08*** | (2006.01) |
| ***H01L 31/052*** | (2014.01) |
| ***H01L 31/0392*** | (2006.01) |

(52) U.S. Cl.

CPC ............ *C03C 4/0092* (2013.01); *G02B 1/105* (2013.01); *G02B 1/11* (2013.01); *G02B 5/08* (2013.01); *H01L 31/0392* (2013.01); *H01L 31/048* (2013.01); *H01L 31/0525* (2013.01); *C03C 2201/20* (2013.01); *C03C 2201/32* (2013.01); *C03C 2201/3423* (2013.01); *C03C 2201/40* (2013.01); *C03C 2201/42* (2013.01); *C03C 2201/54* (2013.01); *C03C 2204/00* (2013.01)

(56) References Cited

U.S. PATENT DOCUMENTS

| | | | | |
|---|---|---|---|---|
| 2004/0162212 | A1 | 8/2004 | Koyama et al. | |
| 2007/0116966 | A1* | 5/2007 | Mellott et al. ................ | 428/432 |
| 2008/0072956 | A1* | 3/2008 | Sharma et al. ................ | 136/256 |
| 2008/0314442 | A1* | 12/2008 | Le Bellac et al. ............. | 136/255 |
| 2010/0122728 | A1* | 5/2010 | Fulton et al. .................. | 136/256 |
| 2010/0130348 | A1* | 5/2010 | Kang et al. .................... | 502/172 |
| 2010/0255980 | A1* | 10/2010 | Fulton et al. .................... | 501/65 |
| 2014/0147679 | A1 | 5/2014 | Dogimont et al. | |

OTHER PUBLICATIONS

U.S. Appl. No. 14/386,438, filed Sep. 19, 2014, Dogimont, et al.

International Search Report Issued Nov. 27, 2012 in PCT/EP12/069034 filed Sep. 27, 2012.

U.S. Appl. No. 14/771,390, filed Aug. 28, 2015, Lambricht, et al.

U.S. Appl. No. 14/773,551, filed Sep. 8, 2015, Lambricht, et al.

U.S. Appl. No. 14/773,489, filed Sep. 8, 2015, Lambricht, et al.

U.S. Appl. No. 14/768,614, filed Aug. 18, 2015, Lambricht, et al.

* cited by examiner

GLASS SHEET WITH HIGH ENERGY TRANSMISSION

1. FIELD OF THE INVENTION

The field of the invention is that of glass having a high energy transmission which can be used in particular in photovoltaic modules or solar mirrors.

In the field of solar power, where glass is used as substrate for solar mirrors or which covers photovoltaic cells, it is, of course, extremely advantageous for the glass employed, through which the rays of the sun have to pass, to exhibit a very high visible and/or energy transmission. The effectiveness of a solar cell is in fact significantly improved by an even very slight increase in this transmission. In particular, an energy transmission of greater than 890 or preferably greater than 90% or even of greater than 91% is highly desired.

In order to quantify the transmission of the glass in the range encompassing the visible region and the solar infrared (or near infrared) region and also a portion of the ultraviolet region, an energy transmission (ET), measured according to the standard ISO9050 between the wavelengths of 300 and 2500 nm, is defined. In the present description and in the claims, the energy transmission is measured according to this standard and given for a thickness of 3.85 mm.

In order to quantify the transmission of the glass in the visible region, a light transmission (LT), calculated between the wavelengths of 380 and 780 nm according to the standard ISO9050 and measured with the illuminant D65 (DLT) as defined by the standard ISO/CIE 10526 taking into account the C.I.E. 1931 reference colorimetric observer as defined by the standard ISO/CIE 10527, is defined. In the present description and in the claims, the light transmission is measured according to this standard and given for a thickness of 3.85 mm under a solid angle of observation of 2°.

2. PRIOR ART

In order to obtain LT and/or ET values of greater than 89%, indeed even of greater than 90%, it is known from the state of the art to reduce the total iron content of the glass (expressed in terms of $Fe_2O_3$ according to the standard practice in the field). Soda-lime-silica glasses referred to as “clear” or “extra clear” still comprise iron as the latter is present as impurity in the majority of the starting materials used (sand, limestone, dolomite, and the like). The iron exists in the structure of the glass in the form of ferric $Fe^{3+}$ ions and of ferrous $Fe^{2+}$ ions. The presence of ferric $Fe^{3+}$ ions confers, on the glass, a slight absorption of low wavelength visible light and a stronger absorption in the near ultraviolet (absorption band centered on 380 nm), whereas the presence of ferrous $Fe^{2+}$ ions (sometimes expressed as oxide FeO) brings about a strong absorption in the near infrared (absorption band centered on 1050 nm). The ferric $Fe^{3+}$ ions provide the glass with a slight yellow coloration while the ferrous $Fe^{2+}$ ions give a pronounced blue-green coloration. Thus, the increase in the total content of iron (in its two forms) accentuates the absorption in the visible region and the infrared region, to the detriment of the light and energy transmission. Furthermore, a high concentration of ferrous $Fe^{2+}$ ions brings about a decrease in the energy transmission. It is also known, in order to further increase the energy transmission of the glass, to oxidize the iron present in the glass, that is to say to reduce the content of ferrous ions in favor of the content of ferric ions, which absorb less. The degree of oxidation of the glass is given by its redox, defined as the ratio by weight of $Fe^{2+}$ atom with respect to the total weight of the iron atoms present in the glass, $Fe^{2+}$/total Fe.

Several solutions have been provided in order to reduce the redox of glass.

It is, for example, known to add cerium oxide ($CeO_2$) to the glass. However, cerium oxide is very expensive and can bring about an undesirable coloration of the glass but in particular is the cause of the phenomenon referred to as “solarization”, in which the energy transmission of the glass decreases strongly over time as a result of the exposure to ultraviolet radiation present in particular in the rays of the sun.

It is also known to add manganese to the glass, which element is capable of oxidizing the iron present in the glass via the reaction: $Mn^{3+}+Fe^{2+}\rightarrow Mn^{2+}+Fe^{3+}$. However, it is known that manganese absorbs in the visible region. This absorption by manganese in the visible region consequently causes a coloration of the glass which is often used to “compensate for” (that is to say, to obtain a more neutral or more appropriate color rendering) an undesirable coloration of the glass on absorbing in other regions of the visible spectrum. This is illustrated, for example, in the applications EP 1 118 597 and WO2005/075368A1, where the aim is to obtain a glass which does not allow UV radiation to pass through (in particular for containers or bottles containing liquids sensitive to UV radiation) by virtue of the addition in particular of “UV-cut” elements, such as cerium and/or vanadium. The latter bring about an undesirable color which is then “neutralized” by the addition of manganese. The phenomenon of coloration of the glass by manganese is, of course, problematic in the case of “extra clear” glass (low iron content) used for solar applications since it reduces the energy transmission. Furthermore, it is also well known from the state of the art, in particular from the application EP 555 552 A1, that manganese “solarizes” during exposure of the glass to UV rays (present in particular in the rays of the sun), thus very strongly impacting the energy transmission of the glass, a parameter of major importance for “extra clear” glass used for solar applications. As a result of this phenomenon of solarization (adding to the undesirable coloration), manganese thus does not consist, according to the state of the art, of an appropriate element to be added to an “extra clear” solar glass composition intended in particular for the manufacture of photovoltaic panels or solar mirrors which will very particularly be exposed to the radiation of the sun.

3. OBJECTIVES OF THE INVENTION

It is in particular an objective of the invention to overcome the disadvantages of the prior art, that is to say to provide a sheet of glass having a high energy transmission.

More specifically, an objective of the invention, in at least one of its embodiments, is to provide a sheet of glass having a high energy transmission (via in particular an oxidation of the glass) which is held significantly stable over time.

Another objective of the invention is provide a solution to the disadvantages of the prior art which is simple and economical.

4. ACCOUNT OF THE INVENTION

In accordance with a specific embodiment, the invention relates to a glass sheet having a composition which comprises, in a content expressed as percentages by total weight of glass:

| | |
|---|---|
| $SiO_2$ | 60-78% |
| $Al_2O_3$ | 0-10% |
| $B_2O_3$ | 0-5% |
| CaO | 0.15% |
| MgO | 0-10% |
| $Na_2O$ | 5-10% |
| $K_2O$ | 0-10% |
| BaO | 0-5% |
| Total iron (expressed in the form of $Fe_2O_3$) | 0.002-0.03%. |

According to the invention, the composition comprises a manganese/(total iron) ratio of 1 to 8.5, the manganese content being expressed in the form of MnO as percentage by weight, with respect to the total weight of the glass.

Thus, the invention is based on an entirely novel and inventive approach as it makes it possible to overcome the disadvantages of the prior art and to solve the technical problem posed. This is because the inventors have demonstrated, surprisingly, for "extra clear" glasses, that it is possible to obtain the oxidizing effect of the manganese while controlling the coloration which can it bring about and while limiting the phenomenon of solarization which appears with time. The inventors have thus discovered that a manganese/(total iron) ratio by weight ranging from 1 to 8.5, in combination with the other criteria of composition of the glass which is defined above, makes it possible to obtain a significant increase in the energy transmission of the glass sheet. In particular, they have demonstrated that this range of manganese/(total iron) ratio by weight makes possible an overall gain in energy transmission as, within this range, the increase in the transmission due to the oxidizing power of the manganese is greater than the loss of transmission due to the phenomenon of coloration. Furthermore, they have discovered that this precise range of manganese/(total iron) ratio by weight results in a glass sheet exhibiting a significant stability of the energy transmission over time and thus a very limited, indeed even nonexistent, phenomenon of solarization.

Throughout the present text, when a range is indicated, the extremities are included. In addition, all the integral and subdomain values in the numerical range are expressly included as if explicitly written. Also throughout the present text, the values of content as percentages are values by weight, expressed with respect to the total weight of the glass.

Figure 2:
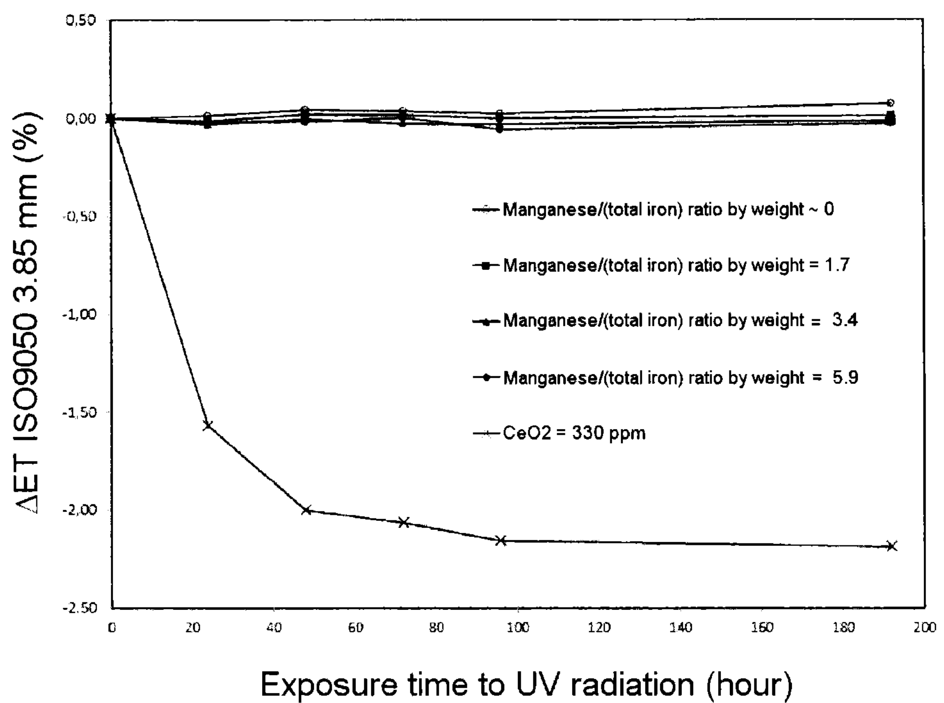

Other characteristics and advantages of the invention will become more clearly apparent on reading the following description and figures, given as illustrative and nonlimiting examples, among which FIG. 1 represents the effect of the manganese/(total iron) ratio by weight on the energy transmission of glass sheets according to the invention and according to the state of the art, and FIG. 2 represents the effect over time of exposure to UV radiation on the energy transmission of glass sheets according to the invention and according to the state of the art.

According to the invention, the composition comprises a total iron (expressed in the form of $Fe_2O_3$) content ranging from 0.002% to 0.03% by weight, with respect to the total weight of the glass. This maximum value of total iron content makes it possible to significantly increase the energy transmission of the glass sheet in comparison with a clear glass. The minimum value makes it possible not to be excessively damaging to the cost of the glass as such low values often require very pure starting materials which are expensive or else a purification of the starting materials. Preferably, the composition comprises a total iron (expressed in the form of $Fe_2O_3$) content ranging from 0.002% to 0.02% by weight, with respect to the total weight of the glass. A total iron (expressed in the form of $Fe_2O_3$) content of less than or equal to 0.02% by weight makes it possible to further increase the energy transmission of the glass sheet. More preferably, the composition comprises a total iron (expressed in the form of $Fe_2O_3$ content) ranging from 0.005% to 0.02% by weight, with respect to the total weight of the glass.

Preferably, the composition of the invention comprises a manganese/(total iron) ratio of 2.5 to 6.5, the manganese content being expressed in the form of MnO as percentage by weight, with respect to the total weight of the glass. Such a range of manganese/(total iron) ratio by weight makes it possible to further increase the energy transmission of the glass sheet.

According to an advantageous embodiment of the invention, the composition comprises a manganese (expressed in the form of MnO) content of 0.005% to 0.2% by weight, with respect to the total weight of the glass. Preferably, the composition comprises a manganese (expressed in the form of MnO) content of 0.01% to 0.2% by weight, with respect to the total weight of the glass. More preferably, the composition comprises a manganese (expressed in the form of MnO) content of 0.01% to 0.15% by weight, with respect to the total weight of the glass. Very preferably, the composition comprises a manganese (expressed in the form of MnO) content of 0.01% to 0.1% by weight, with respect to the total weight of the glass.

According to another advantageous embodiment of the invention, the composition exhibits a redox of 0.01 to 0.4. This redox range makes it possible to obtain optical properties which are highly satisfactory, in particular in terms of energy transmission. Preferably, the composition exhibits a redox of 0.03 to 0.3. Very preferably, the composition exhibits a redox of 0.05 to 0.25.

According to the invention, the composition of the glass sheet can comprise, in addition to the impurities present in particular in the starting materials, a low proportion of additives (such as agents which help the melting or the refining of the glass) or of components originating from the dissolution of the refractories constituting the melting furnaces.

For the reasons mentioned above (preventing the phenomenon of solarization) and according to a preferred embodiment, the composition of the glass sheet comprises a cerium (expressed in the form of $CeO_2$) content ≤0.02% by weight, with respect to the total weight of the glass. Preferably, the composition of the glass sheet comprises a cerium (expressed in the form of $CeO_2$) content ≤0.01% by weight, with respect to the total weight of the glass. More preferably, the composition of the glass sheet comprises a cerium (expressed in the form of $CeO_2$) content ≤0.005% by weight, with respect to the total weight of the glass.

According to another preferred embodiment, the composition of the glass sheet comprises a vanadium (expressed in the form of $V_2O_5$) content ≤0.01% by weight, with respect to the total weight of the glass. Preferably, the composition of the glass sheet comprises a vanadium (expressed in the form of $V_2O_5$) content ≤0.005% by weight, with respect to the total weight of the glass.

According to yet another preferred embodiment, the composition comprises a vanadium (expressed in the form of $V_2O_5$) content ≤0.01% by weight, with respect to the total weight of the glass, and a cerium (expressed in the form of $CeO_2$) content ≤0.02% by weight, with respect to the total weight of the glass. Preferably, the composition comprises a vanadium (expressed in the form of $V_2O_5$) content ≤0.005% by weight, with respect to the total weight of the glass, and a cerium (expressed in the form of $CeO_2$) content ≤0.01% by weight, with respect to the total weight of the glass. Very preferably, the composition comprises a vanadium (expressed in the form of $V_2O_5$) content ≤0.005% by weight, with respect to the total weight of the glass, and a cerium (expressed in the form of $CeO_2$) content ≤0.005% by weight, with respect to the total weight of the glass.

According to yet another preferred embodiment, the composition of the glass sheet comprises an antimony (expressed in the form of $Sb_2O_3$) content <0.2% by weight, with respect to the total weight of the glass. Greater contents of antimony, coupled with manganese, results in the appearance of the phenomenon of solarization. Preferably, the composition of the glass sheet comprises an antimony (expressed in the form of $Sb_2O_3$) content ≤0.15% by weight, with respect to the total weight of the glass.

According to yet another preferred embodiment, the composition of the glass sheet comprises an arsenic (expressed in the form of $As_2O_3$) content <0.01% by weight, with respect to the total weight of the glass.

According to yet another preferred embodiment, the composition of the glass sheet comprises a chromium (expressed in the form of $Cr_2O_3$) content <0.01% by weight, with respect to the total weight of the glass.

The glass sheet according to the invention preferably has an energy transmission (ET), measured for a thickness of 3.85 mm, of at least 89%. Advantageously, the glass sheet according to the invention has an energy transmission (ET), measured for a thickness of 3.85 mm, of at least 90% and better still of at least 91%.

The glass sheet according to the invention preferably has a light transmission, measured with the illuminant D65 (DLT), according to the standard ISO9050 and for a thickness of 3.85 mm, of at least 90.5%.

The glass sheet according to the invention can be a glass sheet obtained by a floating process, a rolling process or any other process known to manufacture a glass sheet starting from a molten glass composition. According to a preferential embodiment according to the invention, the glass sheet is a float glass sheet. The term "float glass sheet" is understood to mean a glass sheet formed by the float glass process, which consists in pouring the molten glass onto a bath of molten tin, under reducing conditions. A float glass sheet comprises, in a known way, a "tin face", that is to say a face enriched in tin in the body of the glass close to the surface of the sheet. The term "enrichment in tin" is understood to mean an increase in the concentration of tin with respect to the composition of the glass at the core, which may or may not be substantially zero (devoid of tin).

The manganese can be incorporated in the composition according to the invention in the form of different sources. It can, for example, be MnO, $MnO_2$ or $KMnO_4$.

In the case of a solar photovoltaic module, the glass sheet according to the invention preferably constitutes the protective substrate (or cover) for the photovoltaic cells.

According to one embodiment of the invention, the glass sheet is coated with at least one transparent and electrically conducting thin layer. This embodiment is advantageous for photovoltaic applications. When the glass sheet is used as protective substrate for a photovoltaic module, the transparent and conducting thin layer is positioned as internal face, that is to say between the glass sheet and the solar cells.

A transparent and conducting thin layer according to the invention can, for example, be a layer based on $SnO_2$:F, $SnO_2$:Sb or ITO (indium tin oxide), ZnO:Al or also ZnO:Ga.

According to another advantageous embodiment of the invention, the glass sheet is coated with at least one antireflection layer. This embodiment is advantageous in the case of photovoltaic applications in order to maximize the energy transmission of the glass sheet and, for example, to thus increase the effectiveness of the solar module comprising this sheet as substrate (or cover) covering the photovoltaic cells. In applications in the solar field (photovoltaic or thermal), when the glass sheet is used as protective substrate, the antireflection layer is positioned as external face, that is to say on the side subjected to sunlight.

An antireflection layer according to the invention can, for example, be a layer based on porous silica having a low refractive index or it can be composed of several layers (stack), in particular a stack of layers of dielectric material alternating layers having low and high refractive indices and terminating in a layer having a low refractive index.

According to one embodiment, the glass sheet is coated with at least one transparent and electrically conducting thin layer on a first face and with at least one antireflection layer on the other face.

According to yet another embodiment, the glass sheet is coated with at least one antireflection layer on each of its faces.

According to another embodiment, the glass sheet is coated with at least one dirt-repellent layer. Such a dirt-repellent layer can be combined with a transparent and electrically conducting thin layer, deposited on the opposite face. Such a dirt-repellent layer can also be combined with an antireflection layer deposited on the same face, the dirt-repellent layer being on the outside of the stack and thus covering the antireflection layer.

According to yet another embodiment, the glass sheet is coated with at least one mirror layer. Such a mirror layer is, for example, a silver-based layer. This embodiment is advantageous in the case of (flat or parabolic) solar mirror applications.

Depending on the applications and/or properties desired, other layers can be deposited on one and/or the other face of the glass sheet according to the invention.

The glass sheet according to the invention can be incorporated in the multiple glazing (in particular double glazing or triple glazing). The term "multiple glazing" is understood to mean a glazing which comprises at least two glass sheets forming a space filled with gas or under vacuum between each pair of sheets. The glass sheet according to the invention can also be laminated and/or tempered and/or toughened and/or bent.

Another subject matter of the invention is a solar photovoltaic module or a mirror for concentrating solar energy, comprising at least one glass sheet according to the invention.

The examples which follow illustrate the invention, without the intention of in any way limiting its coverage.

EXAMPLES

The following examples are intended to compare the gain/the loss in energy transmission obtained for a certain manganese/(total iron) ratio by weight.

The starting materials were mixed in powder form and placed in a crucible for melting, according to composition 1 (total iron=120 ppm) or 2 (total iron=200 ppm) shown below. The manganese was incorporated in each case in the form of $MnO_2$. For all the glasses tested and for each of the compositions 1 and 2, the contents of the components were kept fixed, with the exception of the amount of manganese. The manganese/(total iron) ratio by weight is consequently variable from one glass sample to the other.

| Composition 1 | Content [% by weight] |
|---|---|
| CaO | 9 |
| $K_2O$ | 0.015 |
| $Na_2O$ | 14 |
| $SO_3$ | 0.3 |
| $TiO_2$ | 0.015 |
| $Al_2O_3$ | 0.7 |
| MgO | 4.5 |
| Manganese (expressed as MnO) | variable (from ~0 to 0.18) |
| Total iron (expressed as $Fe_2O_3$) | 0.012 |

| Composition 2 | Content [% by weight] |
|---|---|
| CaO | 9 |
| $K_2O$ | 0.015 |
| $Na_2O$ | 14 |
| $SO_3$ | 0.3 |
| $TiO_2$ | 0.015 |
| $Al_2O_3$ | 0.7 |
| MgO | 4.5 |
| Manganese (expressed as MnO) | variable (from ~0 to 0.18) |
| Total iron (expressed as $Fe_2O_3$) | 0.020 |

After melting, the optical properties of each glass sample in sheet form were determined and in particular the energy transmission (ET) was measured according to the standard ISO9050 for a thickness of 3.85 mm. The ET values were determined in order to confirm if the gain in energy transmission due to the oxidizing effect of the manganese is greater than the loss in transmission due to the coloration caused by said manganese.

FIG. 1 (*a*) represents, for each of compositions 1 and 2, the difference in energy transmission (ΔET) between an extra clear glass according to the state of the art (reference), to which manganese has not been intentionally added and is thus present in the form of traces only (content of manganese in the form of MnO<15 ppm by weight), and each of the glass sheets with variable manganese/(total iron) ratios by weight. FIG. 1 (*b*) is a magnification of FIG. 1 (*a*). A positive ΔET consequently corresponds to a gain in energy transmission, in comparison with a normal extra clear glass (manganese/(total iron)~0), and a negative ΔET corresponds to a loss in energy transmission.

This figure consequently clearly shows that a gain in energy transmission is observed within the range of manganese/(total iron) ratio by weight extending from 1 to 8.5. Thus, the range of manganese/(total iron) ratio by weight claimed makes possible an increase in the energy transmission which is particularly significant in the field of solar power and which can even reach 0.5%.

The ET values for a thickness of 3.85 mm were also evaluated for the same glass sheets over a period of 196 hours of exposure under a UV lamp (Philips HP 125R) in order to confirm the stability of the energy transmission under solarization conditions. The results obtained are illustrated in FIG. 2, which shows the difference (ΔET) between the initial ET (exposure time=0 h) and the ET after a time t of exposure under UV radiation for glass sheets according to the invention (manganese/(total iron) ratio by weight of 1.7, 3.4 and 5.9), for a glass sheet according to the state of the art not comprising manganese or comprising it but in the form of traces (manganese/(total iron).about.0) and for a glass sheet according to the state of the art comprising 0.033% of cerium (expressed as CeO.sub.2). This figure clearly shows that the glass sheets according to the invention exhibit an ET which is significantly stable over time under the effect of UV radiation (absence of solarization observed), in particular in comparison with a glass sheet comprising cerium. This sheet solarizes and shows a drastic decrease in the ET over time under the effect of UV radiation (loss of more than 2% in ET after 196 hours). This figure also shows that the invention makes it possible to maintain a stability over time under UV radiation comparable to the "extra clear" glass sheet according to the state of the art not comprising manganese.

The invention claimed is:

1. A glass sheet having a composition comprising, in a content expressed as percentages by total weight of glass:

60 to 78% $SiO_2$;
0 to 10% $Al_2O_3$;
0 to 5% $B_2O_3$;
0 to 15% CaO;
0 to 10% MgO;
5 to 20% $Na_2O$;
0 to 10% $K_2O$;
0 to 5% BaO;
0.002 to 0.03% total iron expressed in the form of $Fe_2O_3$; and
manganese wherein the composition comprises a manganese/(total iron) ratio of 1 to 8.5, a manganese content being expressed in the form of MnO as percentage by weight, with respect to the total weight of the glass, and wherein the composition comprises a manganese expressed in the form of MnO content of 0.005% to 0.2% by weight, with respect to the total weight of the glass.

2. The glass sheet of claim 1, wherein the composition comprises a manganese/(total iron) ratio of 2.5 to 6.5.

3. The glass sheet of claim 1, wherein the composition comprises a total iron expressed in the form of $Fe_2O_3$ content of 0.002% to 0.02% by weight, with respect to the total weight of the glass.

4. The glass sheet of claim 1, wherein the composition comprises a manganese expressed in the form of MnO content of 0.01% to 0.2% by weight, with respect to the total weight of the glass.

5. The glass sheet of claim 1, further comprising cerium, wherein a cerium content expressed in the form of $CeO_2$ is ≤0.02% by weight, with respect to the total weight of the glass.

6. The glass sheet of claim 5, further comprising vanadium, wherein the vanadium content expressed in the form of $V_2O_5$ is ≤0.005% by weight, with respect to the total weight of the glass, and the cerium content expressed in the form of $CeO_2$ is ≤0.01% by weight, with respect to the total weight of the glass.

7. The glass sheet of claim 1, further comprising vanadium, wherein a vanadium content expressed in the form of $V_2O_5$ is ≤0.01% by weight, with respect to the total weight of the glass.

8. The glass sheet of claim 1, further comprising antimony, wherein an antimony content expressed in the form of $Sb_2O_3$ is <0.2% by weight, with respect to the total weight of the glass.

9. The glass sheet of claim 1, wherein the glass sheet has an energy transmission, measured for a thickness of 3.85 mm, of at least 90%.

10. The glass sheet of claim 1, wherein the glass sheet is coated with at least one transparent and electrically conducting thin layer.

11. The glass sheet of claim 1, wherein the glass sheet is coated with at least one dirt-repellent layer.

12. The glass sheet of claim 1, wherein the glass sheet is coated with at least one antireflection layer.

13. The glass sheet of claim 1, wherein the glass sheet is coated with at least one mirror layer.

14. The glass sheet of claim 1, wherein the composition comprises a total iron expressed in the form of $Fe_2O_3$ content of 0.005% to 0.03% by weight, with respect to the total weight of the glass.

15. A solar photovoltaic module or mirror for concentrating solar energy, comprising at least one glass sheet of claim 1.

16. A glass sheet having a composition consisting essentially of, in a content expressed as percentages by total weight of glass:

60 to 78% $SiO_2$;
0 to 10% $Al_2O_3$;
0 to 5% $B_2O_3$;
0 to 15% CaO;
0 to 10% MgO;
5 to 20% $Na_2O$;
0 to 10% $K_2O$;
0 to 5% BaO;
0.002 to 0.03% total iron expressed in the form of $Fe_2O_3$; and
manganese wherein the composition comprises a manganese/(total iron) ratio of 1 to 8.5, a manganese content being expressed in the form of MnO as percentage by weight, with respect to the total weight of the glass, and wherein the composition comprises a manganese expressed in the form of MnO content of 0.005% to 0.2% by weight, with respect to the total weight of the glass.

17. The glass sheet of claim 16, wherein the composition comprises a manganese/(total iron) ratio of 2.5 to 6.5.

18. The glass sheet of claim 16, wherein the composition comprises a total iron expressed in the form of $Fe_2O_3$ content of 0.005% to 0.03% by weight, with respect to the total weight of the glass.

19. The glass sheet of claim 16, wherein the composition comprises a manganese expressed in the form of MnO content of 0.01% to 0.2% by weight, with respect to the total weight of the glass.

20. The glass sheet of claim 16, further comprising cerium, wherein a cerium content expressed in the form of $CeO_2$ is ≤0.02% by weight, with respect to the total weight of the glass.

* * * * *